(12) United States Patent
Niu et al.

(10) Patent No.: US 7,826,436 B2
(45) Date of Patent: *Nov. 2, 2010

(54) METHOD AND SYSTEM FOR WIRELESS COMMUNICATION OF DATA WITH A FRAGMENTATION PATTERN AND LOW-DENSITY PARITY-CHECK CODES

(75) Inventors: Huaning Niu, Sunnyvale, CA (US); Chiu Ngo, San Francisco, CA (US)

(73) Assignee: Samsung Electronics Co., Ltd., Suwon (KR)

( * ) Notice: Subject to any disclaimer, the term of this patent is extended or adjusted under 35 U.S.C. 154(b) by 272 days.

This patent is subject to a terminal disclaimer.

(21) Appl. No.: 11/906,193

(22) Filed: Oct. 1, 2007

(65) Prior Publication Data

US 2009/0086638 A1 Apr. 2, 2009

(51) Int. Cl.
*H04B 7/216* (2006.01)
*H04J 3/24* (2006.01)
*H04L 12/28* (2006.01)

(52) U.S. Cl. .................. 370/342; 370/238; 370/389; 370/473

(58) Field of Classification Search ......... 370/208–445, 370/465–473; 714/752–801, E11.032; 375/152
See application file for complete search history.

(56) References Cited

U.S. PATENT DOCUMENTS

| 2004/0221223 A1* | 11/2004 | Yu et al. ..................... 714/800 |
| 2006/0034277 A1* | 2/2006 | Jang et al. ................... 370/389 |
| 2006/0034317 A1* | 2/2006 | Hong et al. .................. 370/445 |
| 2007/0165566 A1* | 7/2007 | Khan et al. .................. 370/329 |
| 2009/0086699 A1* | 4/2009 | Niu et al. ..................... 370/342 |
| 2009/0132893 A1* | 5/2009 | Miyazaki et al. ............ 714/776 |

OTHER PUBLICATIONS

Wu, Y. et al., "A Vacation Model with Setup and Close-down Times for Transmitter Buffer of ARQ Schemes," 14th IEEE Proceedings on Personal, Indoor and Mobile Radio Communications (PIMRC), Sep. 7-10, 2003, pp. 2054-2058, vol. 3.
Van Veen, B. et al., "Beamforming: A Versatile Approach to Spatial Filtering," IEEE ASSP Magazine, Apr. 1988, pp. 4-24, vol. 5, No. 2.
* cited by examiner

*Primary Examiner*—Afsar M. Qureshi
(74) *Attorney, Agent, or Firm*—Kenneth L. Sherman, Esq.; Michael Zarrabian, Esq.; Myers Andras Sherman LLP

(57) ABSTRACT

A method and system for wireless data communication is provided, which involves constructing a data payload containing data, partitioning the data payload into fragments, performing LDPC encoding on each fragment, and transmitting the data payload including encoded fragments over a wireless channel.

31 Claims, 5 Drawing Sheets

METHOD AND SYSTEM FOR WIRELESS COMMUNICATION OF DATA WITH A FRAGMENTATION PATTERN AND LOW-DENSITY PARITY-CHECK CODES

FIELD OF THE INVENTION

The present invention relates to wireless communication of data, and in particular to wireless communication of data with a fragmentation pattern.

BACKGROUND OF THE INVENTION

In many wireless communication systems, a frame structure is used for data transmission between a transmitter and a receiver. For example, the IEEE 802.11 standard uses frame aggregation in a Media Access Control (MAC) layer and a physical (PHY) layer.

FIG. 1 shows a general framing structure 10 for a wireless communication system including one or more transmitters and one or more receivers. In a typical transmitter, a MAC layer receives a MAC Service Data Unit (MSDU) 11 from an upper layer and attaches a MAC header 12 thereto, in order to construct a MAC Protocol Data Unit (MPDU) 13. The MAC header 12 includes information such as a source address (SA) and a destination address (DA). The MPDU 13 is a part of a PHY Service Data Unit (PSDU) 14 and is transferred to a PHY layer in the transmitter to attach a PHY header 16 thereto to construct a PHY Protocol Data Unit (PPDU) 18. The PHY header 16 includes parameters for determining a transmission scheme including a coding/modulation scheme. Further, before transmission as a packet from a transmitter to a receiver, a training sequence 19 is attached to the PPDU 18, wherein the training sequence 19 can include channel estimation and synchronization information. The PHY header 16 and the training sequence 19 form a PHY preamble 17.

Most wireless communication protocols include a retransmission mechanism to combat data errors due to fading channels. Existing retransmission mechanisms include stop-and-wait retransmission, go-back-n retransmission and selective retransmission.

Fragmentation is also a well-known scheme for combating the effects of fading channels. Fragmentation involves splitting large blocks of data into small frames for transmission. This has the benefit of requiring smaller buffer sizes and allowing earlier detection of errors in a block of data when each buffer is checked for errors. Fragmentation further enables retransmission of smaller frames in case of errors, and prevents one station from occupying the transmission medium too long for transmitting large blocks of data. Fragmentation is usually used together with selective retransmission for better performance.

Typical retransmission mechanisms using fragments utilize a cyclic redundancy code (CRC) to determine if a fragment is received without error. FIG. 2 shows a conventional PPDU format with multiple fragments and a CRC. Specifically, FIG. 2 shows a conventional packet format 20 with a payload 22 split into multiple payload fragments 24 for transmission at a transmitter. A CRC encoder at the transmitter then encodes k bits of information in each fragment into k+n bits, wherein n is the number of CRC bits that is placed in a corresponding CRC field 26 for each CRC fragment 24. The transmitter then transmits the k+n bits of information to a receiver through a wireless channel, wherein the receiver performs a CRC check per received fragment 24 using the CRC bits in the corresponding CRC field 26. The receiver verifies whether the k bits of information in a fragment are received correctly, wherein n bits of error can be detected.

Transmitting such fragments with CRC information from a transmitter to a receiver is often performed in a transmitter MAC layer. Similarly, performing a CRC check at the receiver is often performed at a receiver MAC layer. However, the CRC processing at the MAC layers of the transmitter and the receiver add device cost and operation complexity.

BRIEF SUMMARY OF THE INVENTION

The present invention provides a method and system for wireless communication of data. One embodiment involves constructing a data payload containing data, partitioning the data payload into fragments, performing low-density parity-check (LDPC) encoding on each fragment, and transmitting the data payload including encoded fragments over a wireless channel.

Constructing a data payload containing the data may include appending a MAC header to the data payload to generate a MAC packet. Further, partitioning the data payload into fragments may include partitioning the data payload in the MAC packet into fragments, and performing LDPC encoding on each fragment further includes performing LDPC encoding on each fragment of the data payload in the MAC packet. Transmitting the data payload may further include appending a PHY header to the MAC packet to generate a data unit frame for transmission over a wireless channel.

Said wireless data communication may further involve receiving a data payload comprising of LDPC encoded data fragments at a receiver over a wireless channel, performing LDPC decoding on the data fragments in the data payload to detect data received in error, and performing selective re-transmission of the data received in error over a wireless channel. Performing LDPC decoding may further include performing iterative decoding. Performing selective re-transmission may further include generating acknowledgement information that identifies the data received in error, and transmitting the acknowledgment information over a wireless channel. The acknowledgment information is received by the transmitter, wherein the transmitter selectively re-transmits only the data identified in the acknowledgment information as received in error.

These and other features, aspects and advantages of the present invention will become understood with reference to the following description, appended claims and accompanying figures.

DETAILED DESCRIPTION OF THE INVENTION

The present invention provides a method and system for wireless communication of data packets with a fragmentation pattern and LDPC encoding. The error detection capability of LDPC codes allows efficient error detection and selective retransmission of erroneous data. This reduces computation complexity while achieving better error detection than CRC.

Figure 1:
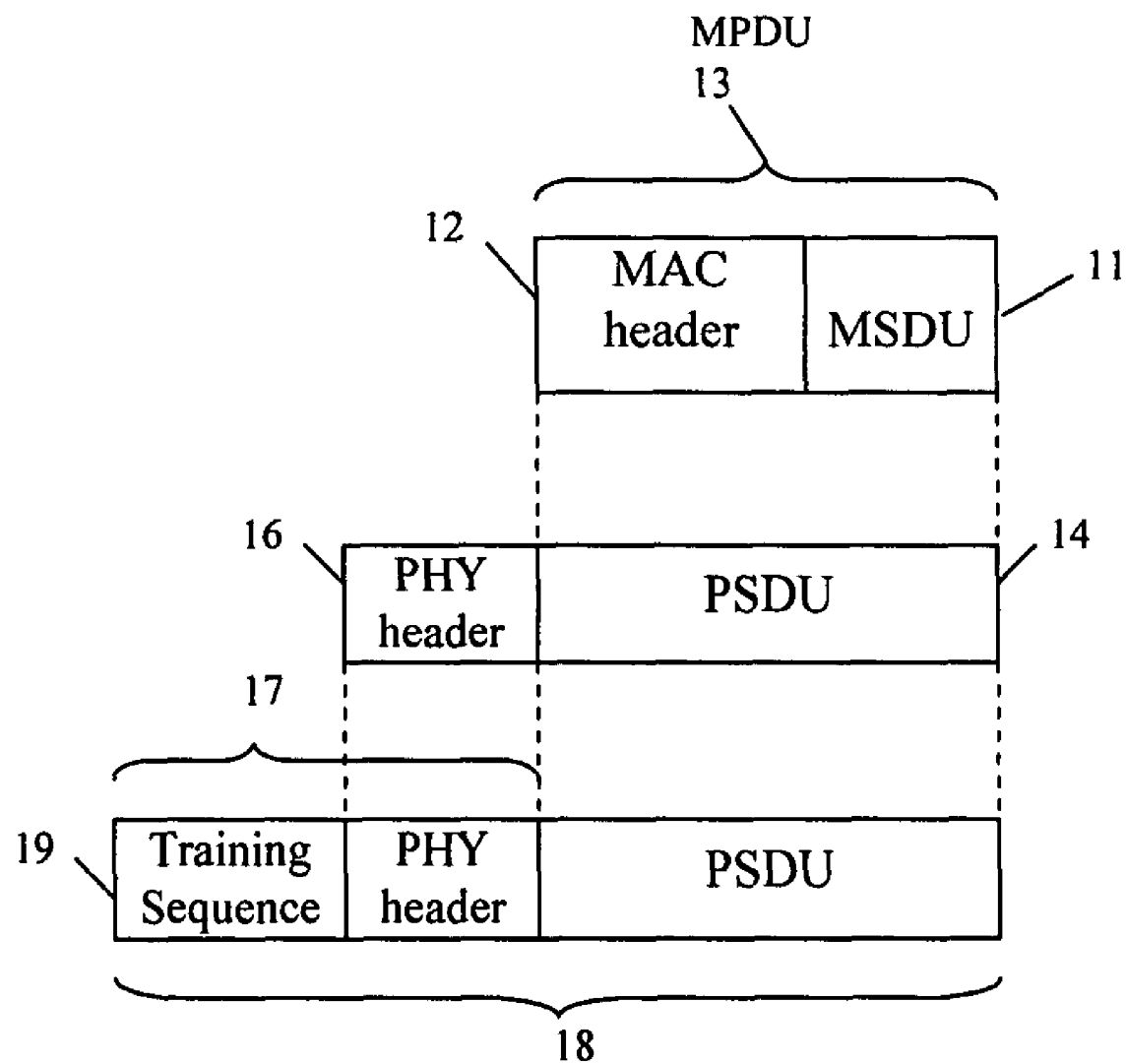
FIG. 1 shows a conventional PPDU frame structure for wireless transmission of data.
Figure 2:
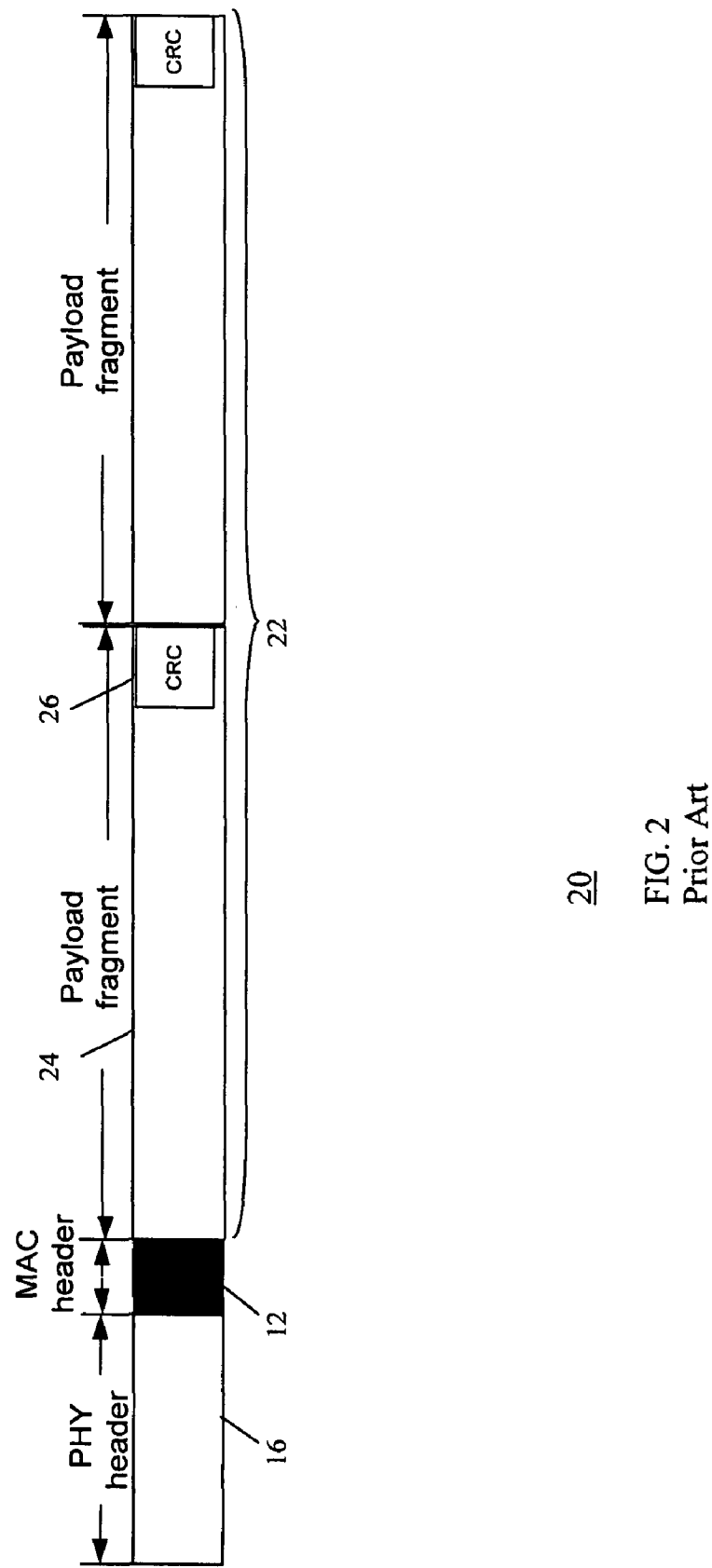
FIG. 2 shows a conventional PPDU format with multiple fragmentation and CRC.
Figure 3:
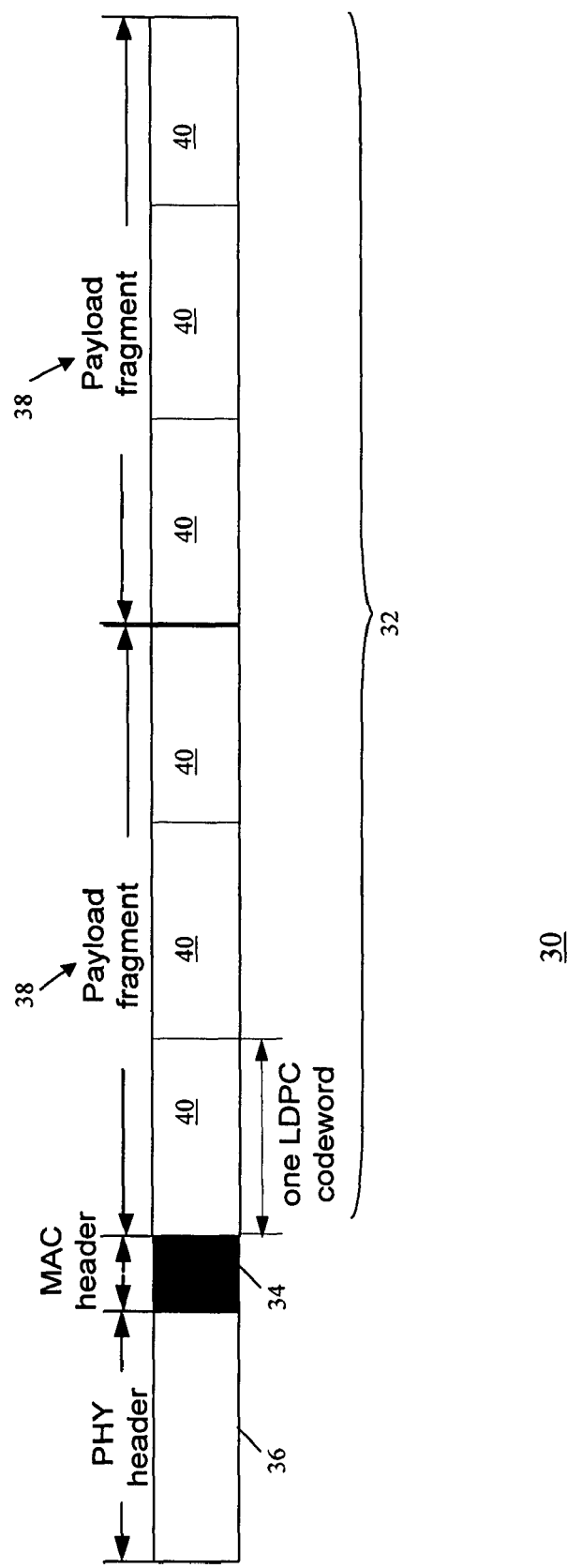
FIG. 3 shows a diagrammatical method of constructing a data packet frame format that uses fragmentation and LDPC codes for error detection and error correction, according to an embodiment of the present invention.

FIG. 3 shows a diagrammatical method of constructing a packet 30 using a frame format that employs a fixed fragmentation pattern and LDPC encoding, according to an embodiment of the present invention. The packet 30 includes a data payload 32, to which a MAC header 34 and a PHY header (PHY preamble) 36 are appended. The payload 32 is fragmented (partitioned) into payload fragments 38. Then LDPC encoding is performed on the data payload fragments 38. As a result, each payload fragment 38 includes one or more LDPC codewords 40.

In the packet 30, CRC information is not necessary because use of LDPC encoding provides error detection capability. This reduces transmission overhead from a transmitter to a receiver over a communication medium such as a wireless channel (e.g., radio frequency (RF)). Upon receiving the packet 30, the receiver decodes the LDPC codewords 40 in each fragment 38. Using the LDPC error detection capability of LDPC codes, the receiver detects bits received in error, and sends acknowledgment (ACK) information to the transmitter accordingly. The ACK information indicates to the transmitter if any of the transmitted bits was received in error, and may therefore be in need of retransmission. The transmitter then selectively retransmits bits received in error.

Each payload fragment 38 can include one or more LDPC codewords 40, wherein the number of codewords 40 per fragment 38 is based on a tradeoff between: (1) the length of the ACK information from a receiver, and (2) re-transmission efficiency. In this example, the ACK information comprises a blockACK that includes a bitmap which indicates the presence or absence of error in each fragment (in another example, the bitmap indicates the presence or absence of error in each codeword 40).

In one data packet communication implementation, said trade-off is considered as follows. In the first example, for a fixed MSDU size and a fixed LDPC codeword length, if each fragment 38 includes only one LDPC codeword 40, then the fragment size will be small and the number of fragments will be large, whereby the corresponding blockACK bit map is long. The benefit of one LDPC codeword 40 per fragment 38 is that the transmitter requires a minimum transmission buffer size and endures the lowest retransmission overhead. In a second example, if a fragment 38 includes multiple LDPC codewords 40, then the fragment size will be large and the number of fragments will be small, whereby the corresponding blockACK bit map is short. In this second example, retransmission efficiency and buffer requirements for the transmitter are higher relative to the first example. Such factors are considered in selecting the number of codewords 40 per fragment 38.

As noted, upon receiving the packet 30, the receiver decodes the LDPC codewords 40 in each fragment 38. If the bit error rate (BER) after LDPC decoding is high (e.g., higher than $10^{-3}$), then fewer codewords 40 per fragmentation format 30 (along with a long bitmap in blockACK) is preferable. When the BER after LDPC decoding is low (e.g., less than $10^{-7}$), then more codewords 40 per fragment 38 (along with a short bitmap in blockACK) are preferable.

Figure 4:
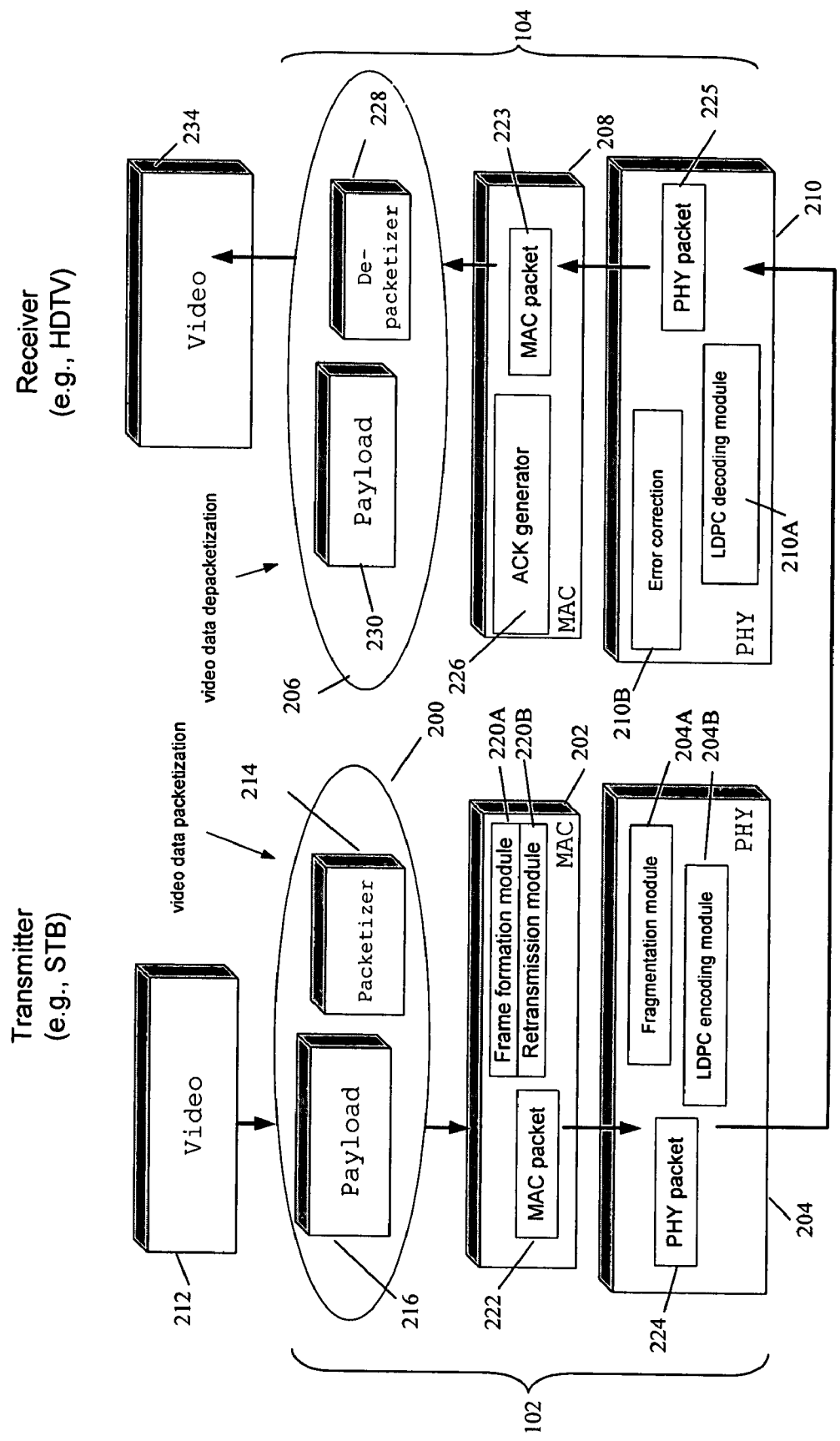
FIG. 4 shows an example functional block diagram of a wireless system for wireless communication of data packets with a fragmentation pattern and LPDC codes, according to an embodiment of the present invention.

FIG. 4 shows a functional block diagram of a wireless communication system 100, implementing construction of a packet using a frame format that employs data fragmentation and LDPC encoding as described, according to an embodiment of the present invention. The system 100 includes a wireless transmitter (sender) 102 and a wireless receiver 104. The transmitter 102 comprises a packetization module 200, a MAC layer 202 and a PHY layer 204. The receiver 104 comprises a depacketization module 206, a MAC layer 208 and a PHY layer 210.

In this example, the transmitter 102 inputs data such as video information 212 from an upper layer. A packetizer 214 in the packetization module 200 generates a data payload 216 from the video information 212. The data payload 216 is provided to the MAC layer 202, wherein a frame formation module 220A in the MAC layer 202 converts the data payload 216 into a MAC packet 222 that includes a MAC header (e.g., the MAC header 34 in FIG. 3). The MAC layer 202 provides the MAC packet 222 to the PHY layer 204. The MAC layer 202 simply passes the potentially large video/audio data payload to the PHY layer 204, wherein the PHY layer 204 fragments (partitions) the payload to the length of each LDPC codeword and performs LDPC encoding.

Specifically, a fragmentation module 204A in the PHY layer 204 fragments the packet payload (e.g., payload 30 in FIG. 3) into payload fragments (e.g., such as the payload fragments 38 in FIG. 3). Further, a LDPC encoding module 204B in the PHY layer 204 performs LDPC on the fragments. As such, each fragment includes one or more LDPC codewords 40. The PHY layer 204 further adds a PHY header (e.g., PHY header 36 in FIG. 3) to the MAC packet 222 to generate a PHY packet 224 as a frame for transmission to the receiver 104 over a wireless channel.

The PHY layer 210 of the receiver 104 receives the transmitted information, wherein a LDPC decoding module 210A in the PHY layer 210 performs LDPC decoding on the received information using iterative decoding. The basic principle of LDPC iterative decoding is that after each iteration, the decoding module 210A determines whether the LDPC parity check equation is satisfied. If yes, then that iteration is terminated and the codeword is obtained as a correct codeword. Otherwise, the iterations continue until a maximum iteration number is reached. If at maximum iteration the LDPC parity check equation is still not correct, then the codeword is determined as erroneous.

Since the LDPC code is a block code, then in one example, using a greater than 1000-bit LDPC codeword typically increases the error detection capability, which is $2d_{min}+1$ (where $d_{min}$ is the minimum hamming distance for the code), to greater than 100 bits of error. This provides better error detection capability than CRC since a 4-byte CRC can only detect 32 bits of error.

Next, an error correction module 210B in the receiver performs error correction for erroneous codewords. The error correction can be implemented by requesting re-transmission of the erroneous codewords (e.g., using stop-and-wait, go-back-n, selective retransmission). Error correction can also be implemented in conjunction with an immediate ACK or a delayed ACK operation by an ACK generator 226 in the MAC layer 208.

In one example, the ACK generator 206 generates a block-ACK that identifies the erroneous fragments (e.g., at least one codeword of a fragment is erroneous), to the transmitter 102. A retransmission module 220B in the transmitter 102 then performs selective retransmission by retransmitting to the receiver 104 a correct copy of only the fragments identified in the blockACK as erroneous. As such, the transmitter 102 performs selective retransmission with fragmentation (the retransmission also utilizes a fragmented frame format, such as that in FIG. 3).

Once the erroneous codewords are corrected, the MAC layer 208 of the receiver constructs a MAC packet 223 and provides the packet payload 230 to the depacketization module 206 to regenerate the video information 234 from the payload. The regenerated video information is provided to the upper layers of the receiver 104.

Figure 5:
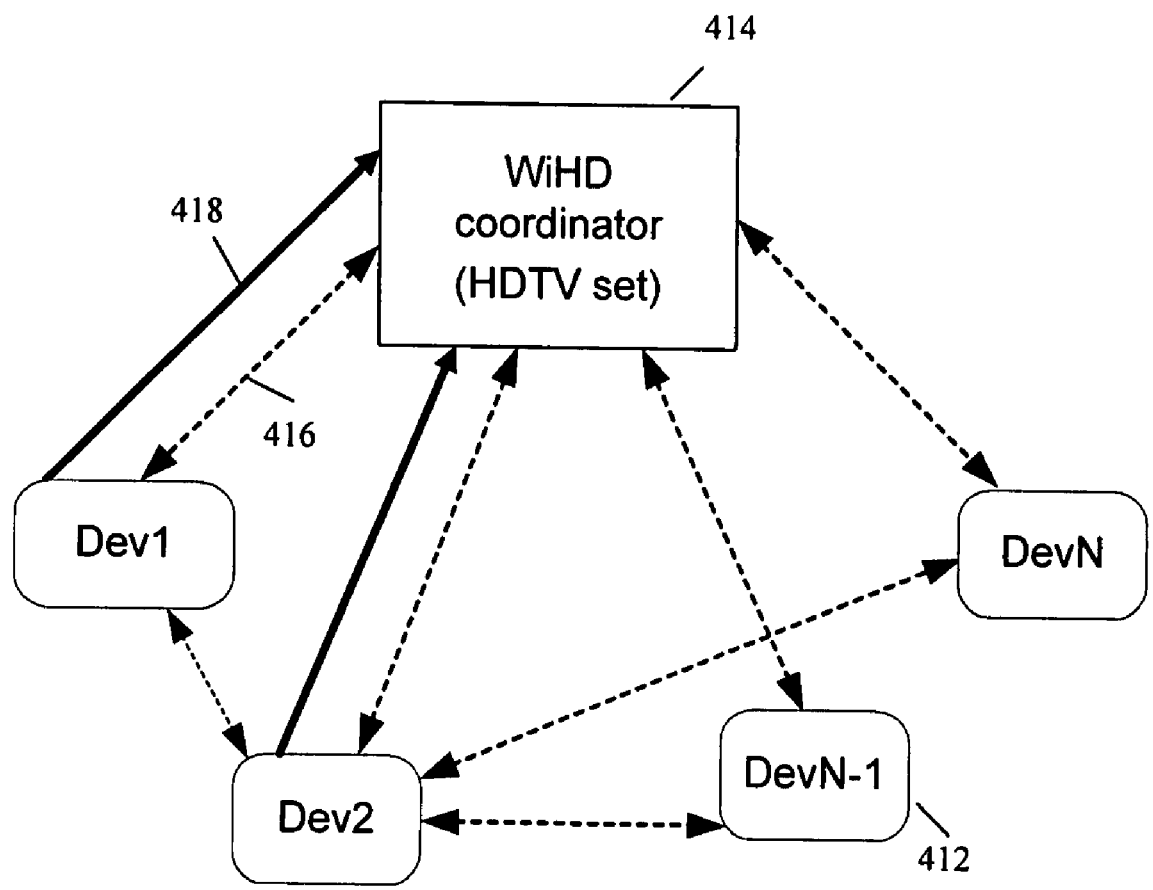
FIG. 5 shows a functional block diagram of a wireless network that implements video packet transmission between wireless devices utilizing a frame format that implements a fragmentation pattern and LDPC codes, according to an embodiment of the present invention.

FIG. 5 shows a functional block diagram of an example wireless network 400 that implements data communication, according to an embodiment of the present invention. An example implementation for a 60 GHz frequency band wireless network is described below. Such implementation is useful with WirelessHD (WiHD) applications. WirelessHD is an industry-led effort to define a wireless digital network interface specification for wireless HD digital signal transmission on the 60 GHz frequency band, e.g., for consumer electronics (CE) and other electronic products. An example WiHD network utilizes a 60 GHz-band mm Wave technology to support a physical (PHY) layer data transmission rate of multi-Gbps (gigabits per second), and can be used for transmitting uncompressed high definition television (HDTV) signals wirelessly. The wireless devices can have multiple antennas, wherein directional beams are formed for transmitting/receiving HD video information using orthogonal frequency division multiplexing (OFDM). The present invention is useful with other wireless communication systems as well.

The wireless network 400 in FIG. 5 implements video transmission (e.g., high definition uncompressed video information) between wireless devices, such as a coordinator 412 and devices 414 (e.g., Dev1, . . . , DevN). In this example, the devices 414 utilize a low-rate wireless channel 416, and may use a high-rate channel 418 for communication therebetween. The coordinator 412 uses a low-rate channel 416 and a high-rate wireless channel 418, for communication with the devices 414. Each device 414 uses the low-rate channel 416 for communications with other devices 414. The high-rate channel 418 only supports single direction unicast transmission over directional beams established by beamforming with, e.g., multi-GB/s bandwidth to support uncompressed HD video transmission. The low-rate channel 416 can support bi-directional transmission, e.g., with at most 40 Mbps throughput. The low-rate channel 416 is mainly used to transmit control frames such as ACK frames.

The wireless devices in the wireless network 400 utilize a frame format that implements a fragmentation pattern and LDPC codes according to the present invention, such as shown by example in FIG. 3. A pair of wireless devices in the wireless network 400 can implement a communication process, such as described by example in relation to FIG. 4.

Further, the present invention is useful with a wireless communication system including wireless communication stations, wherein each wireless communication station is capable of transmitting and/or receiving over a wireless channel. In FIG. 5, the coordinator 412 and each of the devices 414 are a type of wireless communication station. Therefore, a wireless communication station herein can function as a transmitter, a receiver, an access point, a coordinator, an initiator and/or a responder. In one example, transmission of packets over a wireless channel involves transmission by directional transmission beams over the high-rate wireless channel using OFDM. Further, in one example, the payload can comprise a MSDU which the PHY layer converts to a data unit frame comprising a PPDU that implements payload fragmentation and LDPC encoding, according to the present invention.

As such, the present invention provides wireless data transmission using fragmentation and LDPC encoding, which allows selective retransmission with fragmentation, without the complexity of CRC error detection. This is because the retransmission scheme utilizes fixed fragmentation and block acknowledgment (blockACK) that enables such selective retransmission. Further, efficient LDPC encoding is made possible since each fragment is an integer number of LDPC codewords. The present invention further provides the benefit of a simple MAC layer implementation because the MAC layer needs not perform fragmentation or CRC computation. In addition, transmission bandwidth is conserved since CRC bits are not required.

Although in the description hereinabove video information has been used as an example of data for wireless communication according to the present invention, those skilled in the art will recognize that the present invention is not limited to transmission of video information.

Further, as those skilled in the art with recognize, the aforementioned example architectures described above, according to the present invention, can be implemented in many ways, such as program instructions for execution by a processor, as logic circuits, as an application specific integrated circuit, as firmware, etc. The present invention has been described in considerable detail with reference to certain preferred versions thereof; however, other versions are possible. Therefore, the spirit and scope of the appended claims should not be limited to the description of the preferred versions contained herein.

What is claimed is:

1. A method of wireless data communication, comprising:
constructing a data payload containing data;
partitioning the data payload into fragments;
performing low-density parity-check (LDPC) encoding on each data fragment without cyclic redundancy code (CRC) information included in each data fragment, wherein performing LDPC encoding on each data fragment is performed without CRC error checking;
transmitting the data payload including LDPC encoded data fragments over a wireless channel; and
selectively re-transmitting data in said encoded fragments, indicated as received in error by a receiver.

2. The method of claim 1, wherein constructing a data payload containing the data further includes appending a Media Access Control (MAC) header to the data payload to generate a MAC packet.

3. The method of claim 2, wherein partitioning the data payload into fragments further includes partitioning the data payload in the MAC packet into fragments.

4. The method of claim 3, wherein performing LDPC encoding on each fragment further includes performing LDPC encoding on each fragment of the data payload in the MAC packet, wherein each fragment includes one or more LDPC codewords.

5. The method of claim 4, wherein transmitting the data payload further includes appending a PHY (physical) header to the MAC packet to generate a data unit frame for transmission over a wireless channel.

6. The method of claim 5, wherein the data comprises video information.

7. The method of claim 5, wherein transmitting the data unit frame over a wireless channel further includes transmitting the data unit frame by directional transmission beams over the high-rate wireless channel.

8. The method of claim 3, wherein partitioning the data payload into fragments is performed at the PHY layer.

9. The method of claim 1, wherein the payload comprises a MAC Service Data Unit (MSDU).

10. The method of claim 9, wherein the data unit frame comprises a PHY Protocol Data Unit (PPDU).

11. The method of claim 1, wherein transmitting the data payload includes transmitting the data payload including encoded fragments over a 60 GHz wireless channel.

12. The method of claim 1, wherein constructing the data payload containing the data further includes appending a single MAC header to the data payload to generate a MAC packet.

13. A method of wireless data communication, comprising:
   receiving a data payload comprising low-density parity-check (LDPC) encoded data fragments without cyclic redundancy code (CRC) information included in each data fragment over a wireless channel, wherein performing LDPC encoding on each data fragment is performed without CRC error checking;
   performing LDPC decoding on the data fragments in the data payload to detect data received in error; and
   performing selective retransmission of the data received in error over a wireless channel including
      generating acknowledgement information that identifies the data received in error; and
      transmitting the acknowledgment information over a wireless channel.

14. The method of claim 13, wherein LDPC decoding further includes performing iterative decoding.

15. The method of claim 14 further comprising:
   receiving the acknowledgment information; and
   selectively re-transmitting only the data identified in the acknowledgment information as received in error.

16. The method of claim 13, wherein receiving the data payload includes receiving the data payload over a 60 GHz wireless channel.

17. A wireless transmitter, comprising:
   a framing module configured for constructing a data payload containing data;
   a partitioning module configured for partitioning the data payload into data fragments;
   an encoder configured for performing LDPC encoding on each data fragment without having cyclic redundancy code (CRC) information included in each data fragment, wherein performing LDPC encoding on each data fragment is performed without CRC error checking;
   a re-transmission module configured for selective re-transmission of the data in said encoded fragments, indicated as received in error by a receiver; and
   a communication module configured for transmitting the data payload including encoded data fragments over a wireless channel.

18. The wireless transmitter of claim 17, wherein the framing module is further configured for constructing a data payload by appending a Media Access Control (MAC) header to the data payload to generate a MAC packet.

19. The wireless transmitter of claim 18, wherein the partitioning module is further configured for partitioning the data payload into fragments by partitioning the data payload in the MAC packet into fragments.

20. The wireless transmitter of claim 19, wherein the encoder is further configured for performing low-density parity-check (LDPC) encoding on each fragment of the data payload in the MAC packet, wherein each fragment includes one or more LDPC codewords.

21. The wireless transmitter of claim 20, wherein the communication module is further configured for appending a PHY (physical) header to the MAC packet to generate a data unit frame for transmission over a wireless channel.

22. The wireless transmitter of claim 21, wherein the data comprises video information.

23. The wireless transmitter of claim 21, wherein the communication module is further configured for transmitting the data unit frame by directional transmission beams over the high-rate wireless channel.

24. The wireless transmitter of claim 17, wherein the payload comprises a MAC Service Data Unit (MSDU).

25. The wireless transmitter of claim 24, wherein the data unit frame comprises a PHY Protocol Data Unit (PPDU).

26. The wireless transmitter of claim 17, wherein the communication module is further configured for transmitting the data payload including encoded fragments over a 60 GHz wireless channel.

27. A wireless receiver, comprising:
   a communication module configured for receiving a data payload comprising low-density parity-check (LDPC) encoded data fragments over a wireless channel without cyclic redundancy code (CRC) information included in each data fragment, wherein LDPC encoding is performed on each data fragment without CRC error checking, wherein the communication module is further configured for receiving selective retransmission of only data identified in acknowledgment information as received in error;
   a decoder configured for performing LDPC decoding on the data fragments in the data payload to detect data received in error; and
   an acknowledgment module configured for requesting selective retransmission of the data received in error over a wireless channel.

28. The wireless receiver of claim 27, wherein the decoder is further configured for performing LDPC decoding by iterative decoding.

29. The wireless receiver of claim 27, wherein the acknowledgment module is further configured for generating acknowledgement information that identifies the data received in error, and transmitting the acknowledgment information over a wireless channel.

30. The wireless receiver of claim 27, wherein the communication module is further configured for receiving data over a 60 GHz wireless channel.

31. A method of wireless data communication, comprising:
   constructing a data payload containing data including appending a single Media Access Control (MAC) header to the data payload to generate a MAC packet;
   partitioning the data payload into fragments at the PHY layer including partitioning the data payload in the MAC packet into fragments;
   performing low-density parity-check (LDPC) encoding on each data fragment without cyclic redundancy code (CRC) included in each data fragment, wherein performing LDPC encoding on each data fragment is performed without CRC error checking;
   selectively re-transmitting data in said encoded fragments, indicated as received in error; and
   transmitting the data payload including LDPC encoded data fragments over a wireless channel.

* * * * *